(12) United States Patent
Sakamoto et al.

(10) Patent No.: US 7,480,984 B1
(45) Date of Patent: Jan. 27, 2009

(54) METHOD OF SUPPRESSING SUBLIMATION IN ADVANCED THERMOELECTRIC DEVICES

(75) Inventors: Jeffrey S. Sakamoto, San Gabriel, CA (US); Thierry Caillat, Pasadena, CA (US); Jean-Pierre Fleurial, Altadena, CA (US); G. Jeffrey Snyder, Altadena, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 572 days.

(21) Appl. No.: 10/863,835

(22) Filed: Jun. 7, 2004

(51) Int. Cl.
*H05B 3/00* (2006.01)

(52) U.S. Cl. .............. 29/611; 29/613; 29/618; 29/825; 62/3.7; 136/200; 136/201; 136/205; 136/206; 136/240; 148/304; 148/403; 164/37; 164/113; 164/120; 419/4; 419/10

(58) Field of Classification Search .............. 29/611, 29/613, 618, 825; 62/3.7; 136/200, 201, 136/205, 206, 240; 252/62.3 T; 164/37, 164/113, 120; 148/304, 403; 419/4, 10
See application file for complete search history.

(56) References Cited

U.S. PATENT DOCUMENTS

| | | | |
|---|---|---|---|
| 4,377,622 A * | 3/1983 | Liebermann | 428/605 |
| 5,747,728 A | 5/1998 | Fleurial et al. | 136/203 |
| 5,994,639 A | 11/1999 | Johnson et al. | 136/236.1 |
| 6,169,245 B1 | 1/2001 | Sharp | 136/205 |
| 6,188,011 B1 | 2/2001 | Nolas et al. | 136/236.1 |
| 6,207,886 B1 * | 3/2001 | Kusakabe et al. | 136/201 |
| 6,207,888 B1 | 3/2001 | Nolas | 136/236.1 |
| 6,369,314 B1 | 4/2002 | Nolas | 136/201 |
| 6,399,871 B1 | 6/2002 | Sharp | 136/201 |
| 6,458,319 B1 | 10/2002 | Caillat et al. | 420/576 |
| 6,563,039 B2 * | 5/2003 | Caillat et al. | 136/205 |
| 2002/0062854 A1 | 5/2002 | Sharp | 136/203 |
| 2003/0066476 A1 | 4/2003 | Caillat et al. | 117/3 |
| 2006/0157101 A1 * | 7/2006 | Sakamoto et al. | 136/201 |

OTHER PUBLICATIONS

Sakamoto, Jeff et al., "Thermal Stability Characterization of Skutterudite Antimonides," presented at the Space Technology and Application International Forum, Albuquerque, New Mexico, on Feb. 2003, Slides 1-21.

Sakamoto, Jeff et al., "Thermal Stability Characterization of Skutterudite Antimonides," presented at the Space Technology and Application International Forum at Albuquerque, New Mexico, Feb. 2004, Slides 1-22.

* cited by examiner

*Primary Examiner*—Thiem Phan
(74) *Attorney, Agent, or Firm*—Mark Homer

(57) ABSTRACT

A method of applying a physical barrier to suppress thermal decomposition near a surface of a thermoelectric material including applying a continuous metal foil to a predetermined portion of the surface of the thermoelectric material, physically binding the continuous metal foil to the surface of the thermoelectric material using a binding member, and heating in a predetermined atmosphere the applied and physically bound continuous metal foil and the thermoelectric material to a sufficient temperature in order to promote bonding between the continuous metal foil and the surface of the thermoelectric material. The continuous metal foil forms a physical barrier to enclose a predetermined portion of the surface. Thermal decomposition is suppressed at the surface of the thermoelectric material enclosed by the physical barrier when the thermoelectric element is in operation.

10 Claims, 5 Drawing Sheets

METHOD OF SUPPRESSING SUBLIMATION IN ADVANCED THERMOELECTRIC DEVICES

The invention described hereunder was made in the performance of work under NASA contract No. NAS7-03001, and is subject to the provisions of Public Law #96-517 (35 U.S.C. 202) in which the Contractor has elected not to retain title.

FIELD OF THE INVENTION

The present invention relates to suppressing sublimation or loss of mass, and more particularly to suppressing sublimation during the operation of thermoelectric elements.

DESCRIPTION OF RELATED ART

Thermoelectric generators for converting heat to electricity have many different applications including deep space missions where the thermoelectric generator must operate reliably for many years, even decades, if the mission is to be successful. Sublimation is a process by which mass is lost, or more precisely heated molecules can undergo stoichiometric changes, where one or more elements are liberated from the material. Sublimation of material components in thermoelectric generators can diminish thermoelectric performance. Thus, there exists a need to suppress sublimation caused by heat in order to extend the life and reliability of thermoelectric generators.

BRIEF SUMMARY OF THE INVENTION

The present invention, as defined in the claims, overcomes the disadvantages associated with existing thermoelectric elements by providing a physical barrier that is bonded to the outer surface of the thermoelectric elements. The physical barrier suppresses mass loss due to thermal decomposition or sublimation.

According to an embodiment of the invention, a method of applying a physical barrier to suppress thermal decomposition near a surface of a thermoelectric material includes applying a continuous metal foil to a predetermined portion of the surface of the thermoelectric material, physically binding the continuous metal foil to the surface of the thermoelectric material using a binding member, and heating, in a predetermined atmosphere, the applied and physically bound continuous metal foil and the thermoelectric material to a sufficient temperature in order to promote bonding between the continuous metal foil and the surface of the thermoelectric material. The bonded continuous metal foil forms a physical barrier to enclose a portion of the surface. Accordingly, thermal decomposition is suppressed at the surface of the thermoelectric material enclosed by the physical barrier.

According to another embodiment of the invention, a skutterudite (SKD) thermoelectric element is fabricated by inserting a continuous metal foil as a liner in a die for casting the thermoelectric element, loading the die with a powdered SKD material, and applying heat and pressure to the die containing the continuous metal foil and the SKD material to promote a sintering of the powdered SKD material and forming a bond between the sintered SKD material and the continuous metal foil liner. The continuous metal foil has a first surface adjacent to the die wall and a second surface opposite the first surface and oriented towards an interior region of the die. A predetermined portion of the powdered SKD material is disposed within the interior region of the continuous metal foil liner.

BRIEF DESCRIPTION OF THE DRAWINGS

The exact nature of this invention, as well as the objects and advantages thereof, will become readily apparent upon consideration of the following specification in conjunction with the accompanying drawings in which like reference numerals designate like parts throughout the figures thereof and wherein.

Cross-hatching patterns in the above referenced drawings is not intended to denote coloration, but rather to distinguish drawing regions.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the intention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The present invention, as defined in the claims, includes a novel method of suppressing sublimation in advanced thermoelectric materials and is specifically tailored for use with skutterudite (SKD) antimonides. Further, the presently preferred embodiments teach the application of a thin, continuous metal film on the surface of SKD thermoelectric elements. The presence of this metal film significantly decreases the sublimation rate of antimony whether the metal film is in close contact with the surface of the thermoelectric element or if the metal film is chemically bonded to the surface.

Even though a chemically bonded film is preferred, especially if operation in oxidizing atmospheres such as air is required, another embodiment includes a novel process for fabricating SKD devices that binds the protective film to the surface of the SKD elements. In this case, the sublimation barrier was specifically designed to improve bonding while preserving thermoelectric performance.

Thermoelectric materials primarily degrade through thermal decomposition or sublimation. One or more elements sublime from the hot side of a thermoelectric couple, which changes stoichiometry thereby diminishing thermoelectric performance of the thermoelectric materials. For example, elements that sublime from their respective thermoelectric materials are Germanium (Ge) from SiGe, Tellurium (Te) from Pb/Te and now Antimony (Sb) from SKDs. Two of the SKD antimonides of interest are $CoSb_3$ (n-type) and $CeFe_3$-$xCo_xSb_{12}$ (p-type). When these compounds are subjected to the predicted operating conditions (700° C. and <$10^5$ Torr.) antimony sublimes from the surface forming an antimony depletion layer that advances toward the center of the thermoelectric element.

Figure 1:
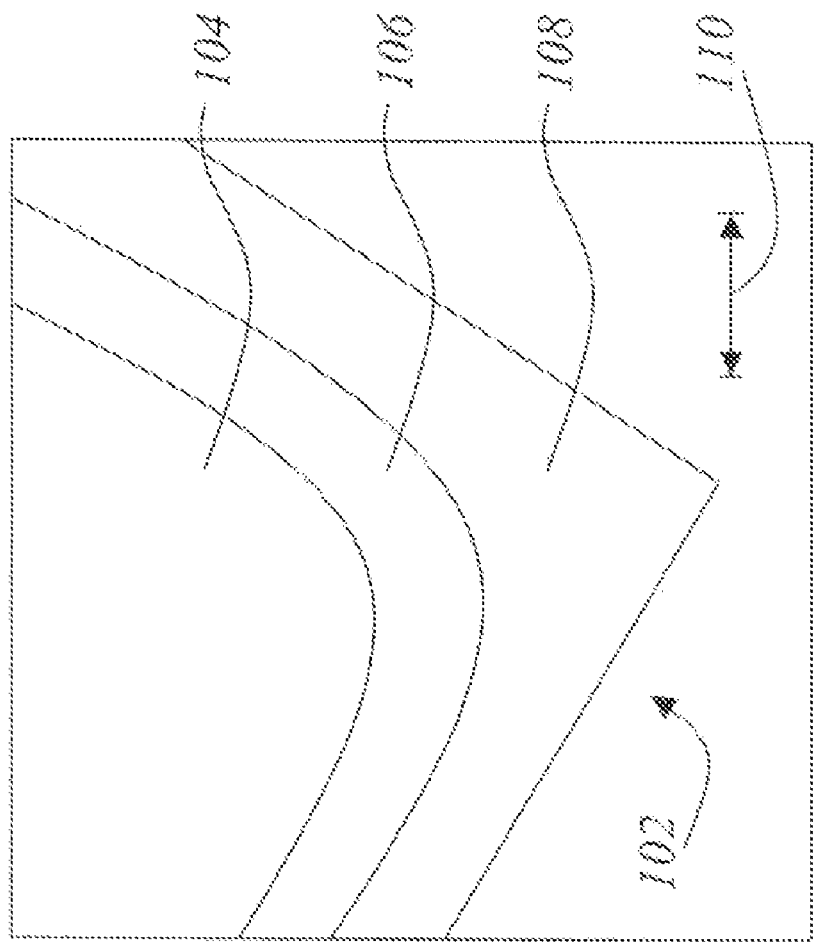
FIG. 1 is a cross-sectional view of an uncoated n-type SKD element heated at 600° C. for five days under a vacuum of less than $10^{-5}$ Torr and showing antimony depletion regions.

In reference to FIG. 1, a cross-section is shown of an uncoated n-type SKD thermoelectric sample 102 that was heated at 600 C for 5 days under a vacuum. The core region 104 remains unchanged as $CoSb_3$ (n-type) SKD antimonide. A first depletion region 106 has lost antimony due to sublimation and is converted into $CoSb_2$. A second depletion region 108 has lost antimony due to further sublimation from $CoSb_2$ and is converted into CoSb. The reference scale 110 is approximately 200 μm.

As the depletion layers (106, 108) advance, the change in stoichiometry diminishes thermoelectric properties, thus decreasing thermal-to-electric conversion efficiency. Although it is difficult to suppress sublimation completely, in most thermoelectric systems, there are practical limits for mass loss due to sublimation. For example, $Si_3N_4$ coated SiGe elements lost mass at a rate of ~$10^{-6}$ g/h-cm2 under normal operating conditions for SiGe, which is considered to be acceptable. In comparison, SKD loses antimony at a rate of ~$10^{-3}$ g/h-cm2 at 700° C., which is not considered acceptable for practical applications. Thus, a method for suppressing or preventing antimony sublimation must be established if antimony-based SKDs are to be considered for use in dependable, advanced thermoelectric generators.

Initially, thermal stability experiments were conducted to characterize the thermal stability of n-type and p-type SKD antimonides. The experiments involved exposing the samples to conditions similar to actual, predicted environments. For example, samples were heated under a vacuum (<$10^{-5}$ Torr.) or one atmosphere of argon in a quartz ampoule at 600° C., 700° C. or 800° C. for several days at a time.

Figure 2:
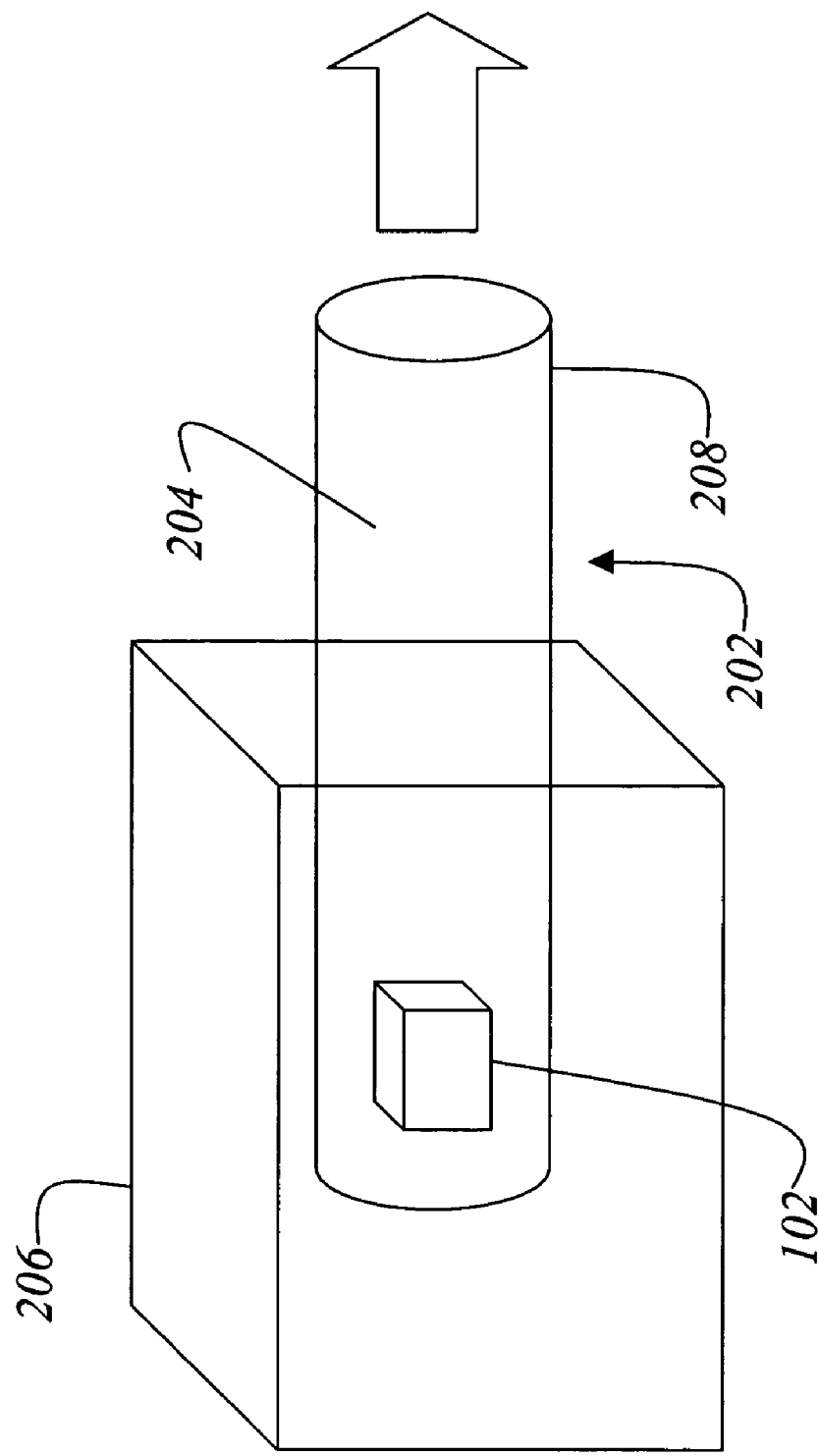
FIG. 2 shows an experimental setup for characterizing sublimation behavior.

In reference to FIG. 2, a thermoelectric sample 102 was placed in a quartz ampoule 202 with a predetermined atmosphere 204 and heated in a furnace 206. Within the furnace 206 is considered the "hot side" while at the distal end 208 of the quartz ampoule 202 is considered the "cold side" at approximately 25° C. The predetermined atmosphere was either a vacuum of less than $10^{-5}$ Torr, or under a cover gas of argon at an ambient pressure of one atmosphere. The thermoelectric sample 102 was heated under the vacuum or under the cover gas for approximately 72 hours. The heated sample was then cooled and cross-sectioned for analysis using optical microscopy and microprobe analyses to measure antimony sublimation rates.

Through the course of the work, a key observation was made. The side of the samples, typically cubic in shape, facing the inner wall of the quartz ampoule decomposed at a slower rate as compared with the other faces of the sample. In an n-type sample heated to 800° C. in Argon, the side facing the quartz ampoule decomposed to the form of di-antimonide, $CoSb_2$, while the opposing side decomposed to form the mono-antimonite, CoSb. Several samples exhibited the same behavior under similar conditions, thus indicating the presence of the quartz ampoule, in close contact with the sample, significantly slowed the antimony sublimation rate.

Figure 3:
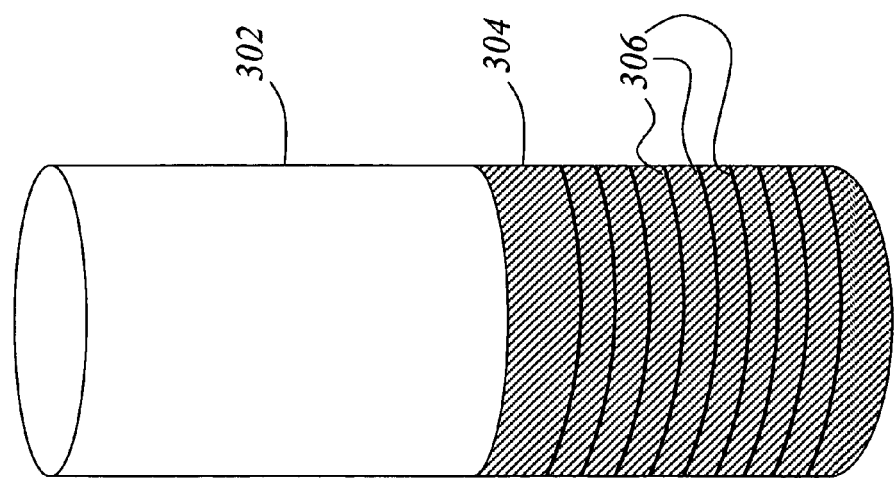
FIG. 3 shows a side-view of a SKD element wrapped with foil and bound with wire according to an embodiment of the invention.

Working on this notion, a sample of n-type SKD element was tightly wrapped in niobium foil that was selected for its chemical stability, and bound with KANTHAL® (nickel-chromium) wire. In reference to FIG. 3, the sample SKD element 302 was wrapped in niobium foil 304 and then bound with at least one course of nickel-chromium wire 306. That is, the nickel-chromium wire encircled the sample SKD element in the region covered by the niobium film 304 at least once. The nickel-chromium wire 306 may be one continuous wire 306 that is wrapped a plurality of courses around a portion of the SKD element, or each course may be wrapped using one segmented piece of wire 306. The type of wire is not limited to KANTHAL® wire or including a nickel-chromium alloy, but may be any high-temperature resistant wire. The wrapped and bound SKD element was heated in a vacuum (<$10^{-5}$ Torr.) at 700° C.

Figure 4:
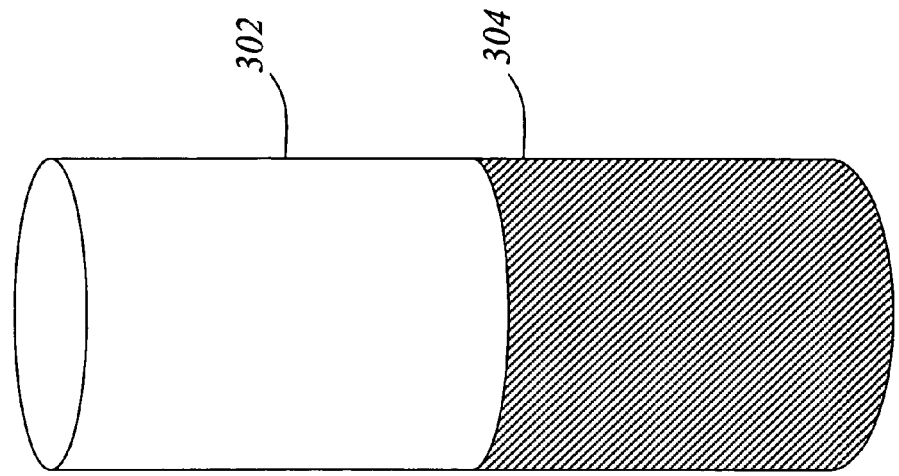
FIG. 4 shows a side-view of the SKD element after heating, cooling, and removal of the binding wire according to an embodiment of the invention.

The wrapped and bound SKD element was then cooled and the binding member wire 306 was removed as shown in FIG. 4. The resulting SKD element was then cross-section showing that no depletion layer formed near the surface of the SKD element which was covered by the niobium foil indicating the niobium foil had completely eliminated antimony sublimation at 700° C. This was a considerable improvement over uncoated samples when considering the uncoated samples decomposed to form the lowest antimonide, CoSb, at the surface at only 600° C.

Through experimentation, it appeared that the inner wall of the ampoule and the niobium foil suppress antimony sublimation by impeding mass transport since the mean free path X of antimony under these conditions was predicted to be on the order of tens of centimeters, thus any surface closer than this acts as an impediment to antimony vapor transport. This was confirmed in an experiment in which an SKD element was thermally insulated by a shroud of niobium foil. A hole was made in the shroud to allow thermocouple access through which antimony vapor incidentally passed.

As the antimony vapor condensed on the inner wall of the vacuum bell jar, at a distance of approximately 10 cm from the SKD surface, it made an exact duplicate of the hole pattern including a "shadow" created by a 0.250 mm diameter thermocouple lead. This result indicates that the first antimony vapor collision was with the inner wall of the bell jar, thus confirming that the mean free path of antimony vapor was greater than 10 cm. If this hypothesis is correct, further sublimation suppression may be achieved by chemically binding the foil to the surface of the thermoelectric material.

Figure 6:
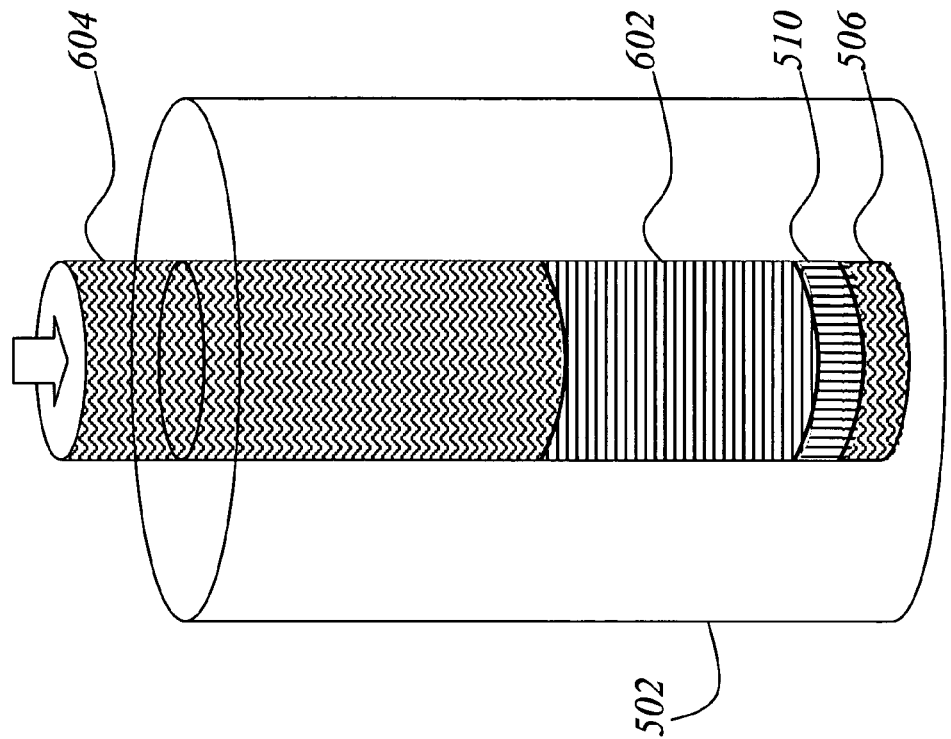
FIG. 6 shows a side-view of a die with a foil liner inserted in the die cavity, powdered SKD material inserted in the die cavity, and a plunger for applying pressure according to an embodiment of the invention.
Figure 5:
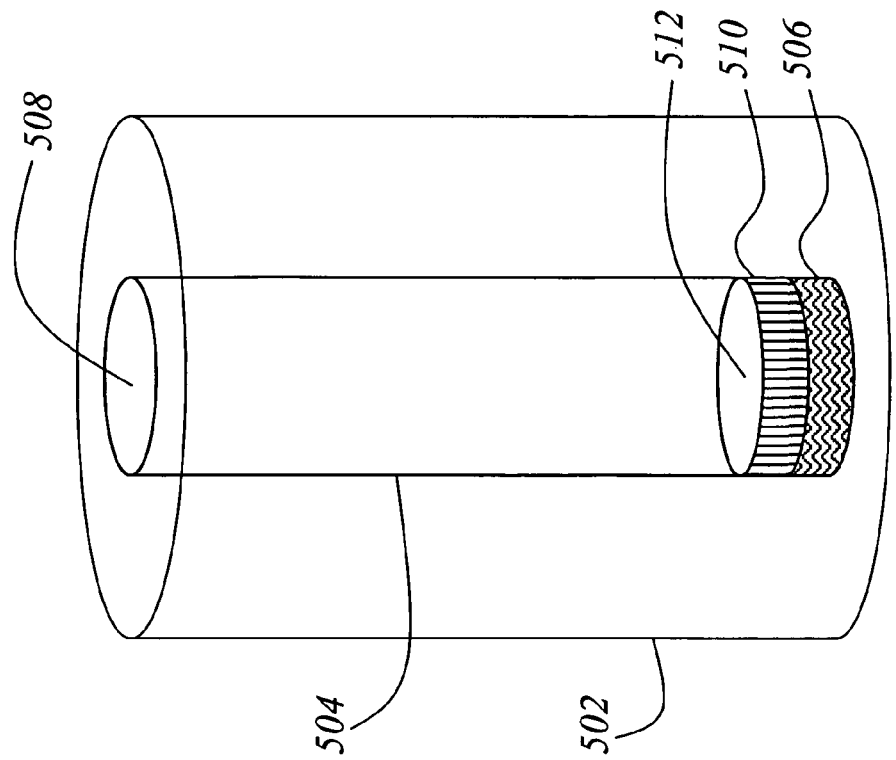
FIG. 5 shows a side-view of a die with a foil liner inserted in the die cavity according to an embodiment of the invention.

Thermoelectric elements can be fabricated using powder metallurgy whereby the thermoelectric material, in powder form, is hot-pressed in a die, removed and processed. The high temperature and pressure act to promote bonding or sintering between particles and as such is the ideal step to consider for the adherence of a coating. In another embodiment, a 25-micron thick foil ribbon was inserted in a graphite die. In reference to FIG. 5, in one embodiment a graphite die 502 includes a hollow cylindrical region or die cavity 504 and is closed on one end with a graphite plug 506 and an opening 508 at the other end. A foil ribbon 510 is inserted and lines the inner wall of the graphite die 502 to define an interior region 512. In reference to FIG. 6, an SKD powder 602 is loaded into the open end 508 of the die cavity 504 to fill the region 512 defined by the inside of the foil ring 510 as well as a portion of the die cavity 504 above the foil ring 510.

Figure 7:
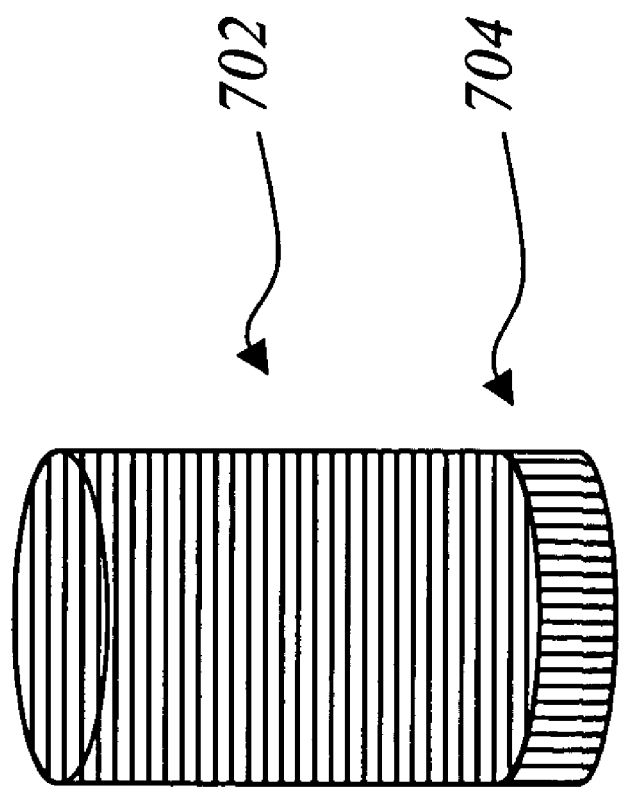
FIG. 7 shows a coated SKD thermoelectric element following fabrication according to an embodiment of the invention.

A plunger 604 is then lowered in the cavity and the SKD powder 602 and foil ring 510 were simultaneously heated and pressed at approximately 535 C and 120 MPa for approximately one hour. The combination of elevated pressure and temperature promotes bonding between the foil and SKD powder particles during the sintering process, which cannot be achieved with films that are deposited via a process such as sputtering or chemical vapor deposition (CVD). As shown in FIG. 7, upon cooling and removal from the die 502, the cylindrically shaped "legs" of sintered SKD material 702 have a well-bound coating 704 on a predetermined portion of the surface of the SKD material 702. Titanium (Ti) foil forms a stable bond between SKD and BiTe segments in SKD/BiTe, segmented, unicouple legs. Titanium is also stable at 700° C. and has a similar coefficient of thermal expansion and is therefore a suitable material to consider as a sublimation coating.

Several sublimation experiments were conducted on both Titanium foil coated n and p-type SKD elements including the use of 12.5 µm thick foil as a physical barrier bonded to the surface of the SKD elements. The resultant data indicated that the Ti foil clearly suppressed antimony sublimation. Although the leg was heated in a thermal gradient, the temperature of the leg beneath the titanium foil was above the antimony sublimation temperature. Further, substantial sublimation did occur where the surface was uncoated, as evidenced by the depletion layers.

The apparatus and method may be used in radioisotope thermal generator (RTG) technology, but can also be used in waste-heat recovery applications such as for electrical power generation from automobile waste-heat. Since sublimation of Tellurium in Bi/Te and Pb/Te-based RTGs can be substantial, the method and apparatus may be applied to suppress Tellurium sublimation as well. Tellurium has vapor phase properties that are similar in many ways to the vapor phase properties of antimony and thus the barrier concept may have a similar effect.

Those skilled in the art will appreciate that various adaptations and modifications of the just-described preferred embodiments can be configured without departing from the scope and spirit of the invention. Therefore, it is to be understood that, within the scope of the amended claims, the invention may be practiced other than as specifically described herein.

What is claimed is:

1. A method of applying a physical barrier to suppress thermal decomposition near a surface of a thermoelectric element, comprising the steps of:
    having the thermoelectric element with a side surface and an exposed end surface;
    applying a continuous metal foil over the exposed end surface and up a portion of the side surface of the thermoelectric element;
    physically binding the continuous metal foil to the exposed end surface and portion of the side surface of the thermoelectric element using a binding member, the continuous metal foil forming a physical barrier enclosing the exposed end surface and portion of the side surface; and
    heating in a predetermined atmosphere the applied and physically bound continuous metal foil and the thermoelectric element to a sufficient temperature in order to promote bonding between the continuous metal foil and the exposed end surface and portion of the side surface of the thermoelectric element,
    whereby thermal decomposition is suppressed at the surface of the thermoelectric material enclosed by the physical barrier.

2. The method of claim 1, further comprising:
    cooling the applied and physically bound continuous metal foil and the thermoelectric element; and
    removing the binding member to leave the bonded continuous metal foil attached to the exposed end surface and portion of the side surface of the thermoelectric element.

3. The method of claim 1, wherein thermal decomposition is suppressed by impeding mass transport.

4. The method of claim 1, wherein the thermoelectric element comprises a material skutterudite (SKD) antimonide.

5. The method of claim 1, wherein the continuous metal foil is composed of a metallic material selected from the group consisting of niobium and titanium.

6. The method of claim 1, wherein physically binding the continuous metal foil to the exposed end surface and portion of the side surface includes applying at least one winding of a high-temperature resistant wire.

7. The method of claim 6, wherein the high-temperature resistant wire includes a nickel-chromium alloy.

8. The method of claim 1, wherein heating the applied and physically bound thermoelectric element to the sufficient temperature to promote bonding between the continuous metal foil and the exposed end surface and portion of the side surface of the thermoelectric element includes heating to a temperature of approximately 700° C.

9. The method of claim 1, wherein the predetermined atmosphere is one of a vacuum less than approximately $10^{-5}$ Torr and a cover gas at one atmosphere.

10. The method of claim 9, wherein the cover gas predominately contains argon.

* * * * *